US 8,045,941 B2

(12) United States Patent
Muhammad et al.

(10) Patent No.: US 8,045,941 B2
(45) Date of Patent: Oct. 25, 2011

(54) METHODS AND APPARATUS TO IMPLEMENT RECEIVER LINEARITY ENHANCEMENT

(75) Inventors: Khurram Muhammad, Dallas, TX (US); Chandana Fernando, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 908 days.

(21) Appl. No.: 11/847,080

(22) Filed: Aug. 29, 2007

(65) Prior Publication Data

US 2009/0061809 A1 Mar. 5, 2009

(51) Int. Cl.
*H04B 7/00* (2006.01)
*H04B 17/00* (2006.01)
(52) U.S. Cl. ............... 455/232.1; 455/250.1; 455/67.13
(58) Field of Classification Search ................ 455/63.1, 455/67.13, 135, 222, 226.3, 114.3, 242.2, 455/239.1, 240.1, 245.1, 250.1, 136, 232.1
See application file for complete search history.

(56) References Cited

U.S. PATENT DOCUMENTS

| 5,175,883 | A | * | 12/1992 | Ueno ........................ 455/242.2 |
| 6,324,387 | B1 | * | 11/2001 | Kamgar et al. ............ 455/234.1 |
| 6,804,501 | B1 | * | 10/2004 | Bradley et al. ................ 455/138 |
| 6,813,510 | B1 | * | 11/2004 | Kunzinger ................. 455/562.1 |
| 6,819,936 | B2 | * | 11/2004 | Weissman ..................... 455/522 |
| 7,200,372 | B2 | * | 4/2007 | Carpineto et al. ............ 455/130 |
| 7,218,905 | B1 | * | 5/2007 | Molnar et al. ............. 455/240.1 |
| 7,483,501 | B1 | * | 1/2009 | Michaels, Jr. ................ 375/346 |
| 2007/0098118 | A1 | | 5/2007 | Muhammad et al. |

* cited by examiner

*Primary Examiner* — Sonny Trinh
(74) *Attorney, Agent, or Firm* — Ronald O. Neerings; Wade James Brady, III; Frederick J. Telecky, Jr.

(57) ABSTRACT

Methods and apparatus to implement receiver linearity enhancement are described. One example method includes controlling receiver gain by determining a level of a received signal that is to be provided to a radio frequency component; determining if the level of the received signal would cause the radio frequency components internally generated noise to increase; and when the level of the received signal would cause the radio frequency components internally generated noise to increase, reducing the level of the received signal prior to providing the received signal to the radio frequency component.

25 Claims, 8 Drawing Sheets

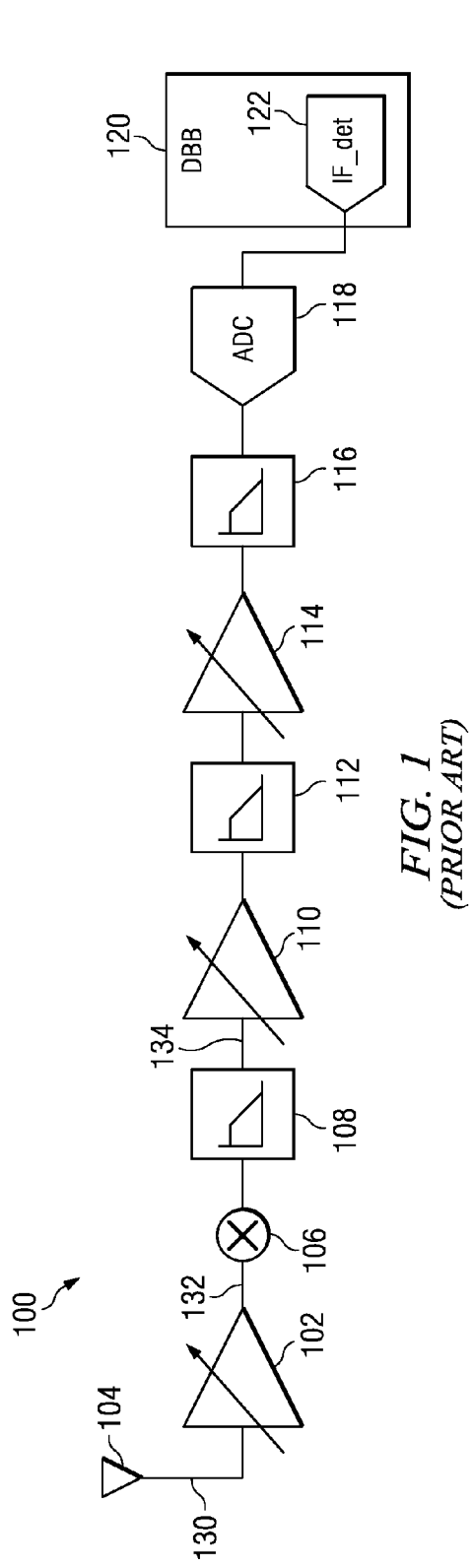
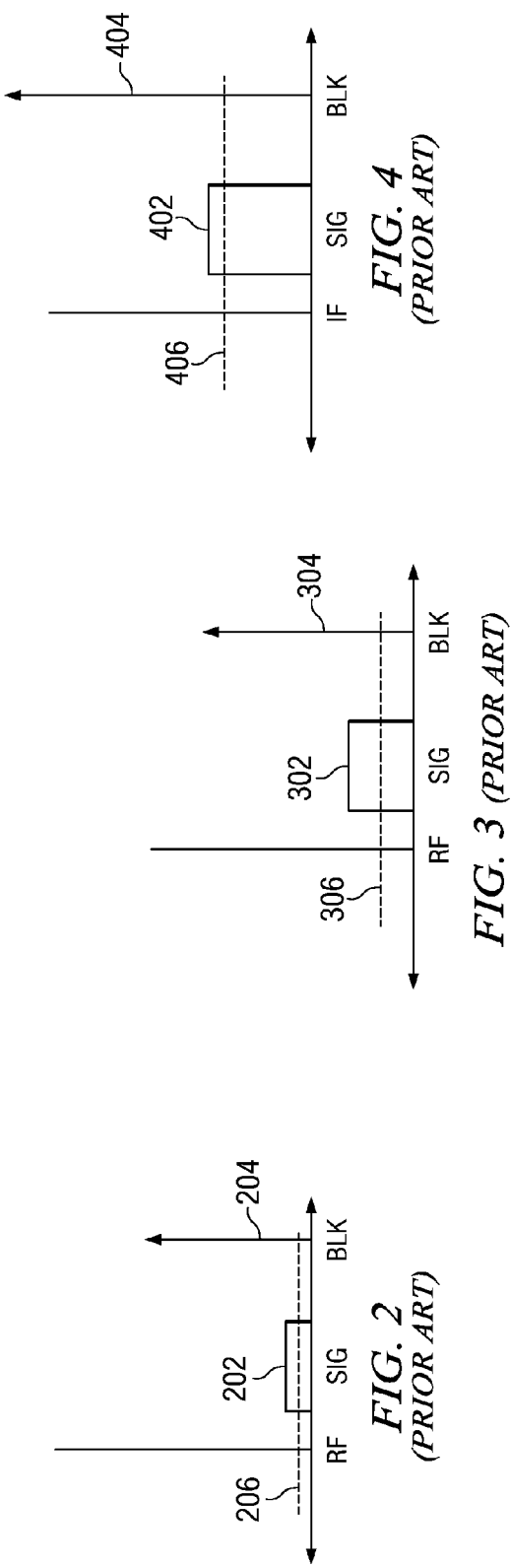
FIG. 1 (PRIOR ART)
FIG. 3 (PRIOR ART)
FIG. 2 (PRIOR ART)
FIG. 4 (PRIOR ART)

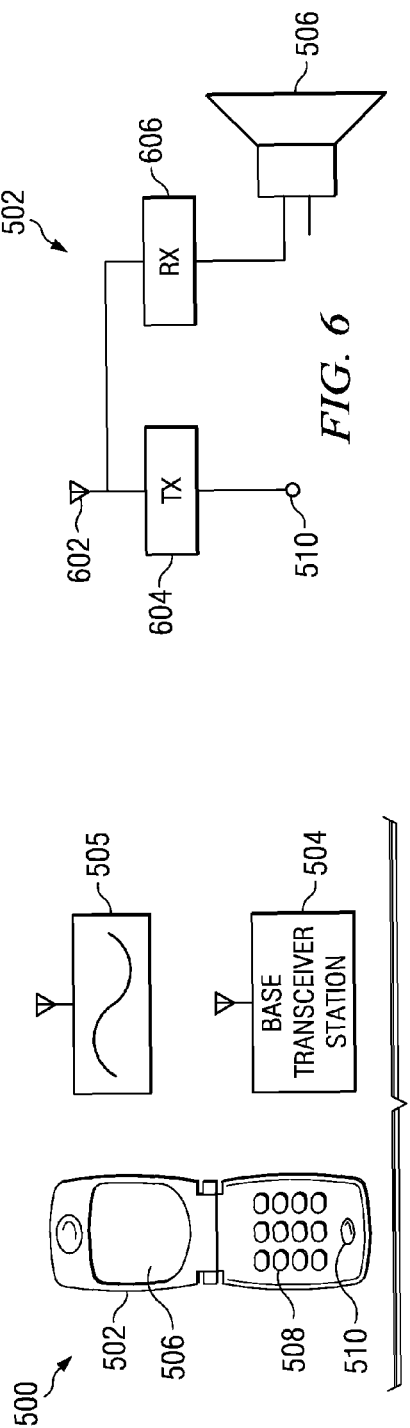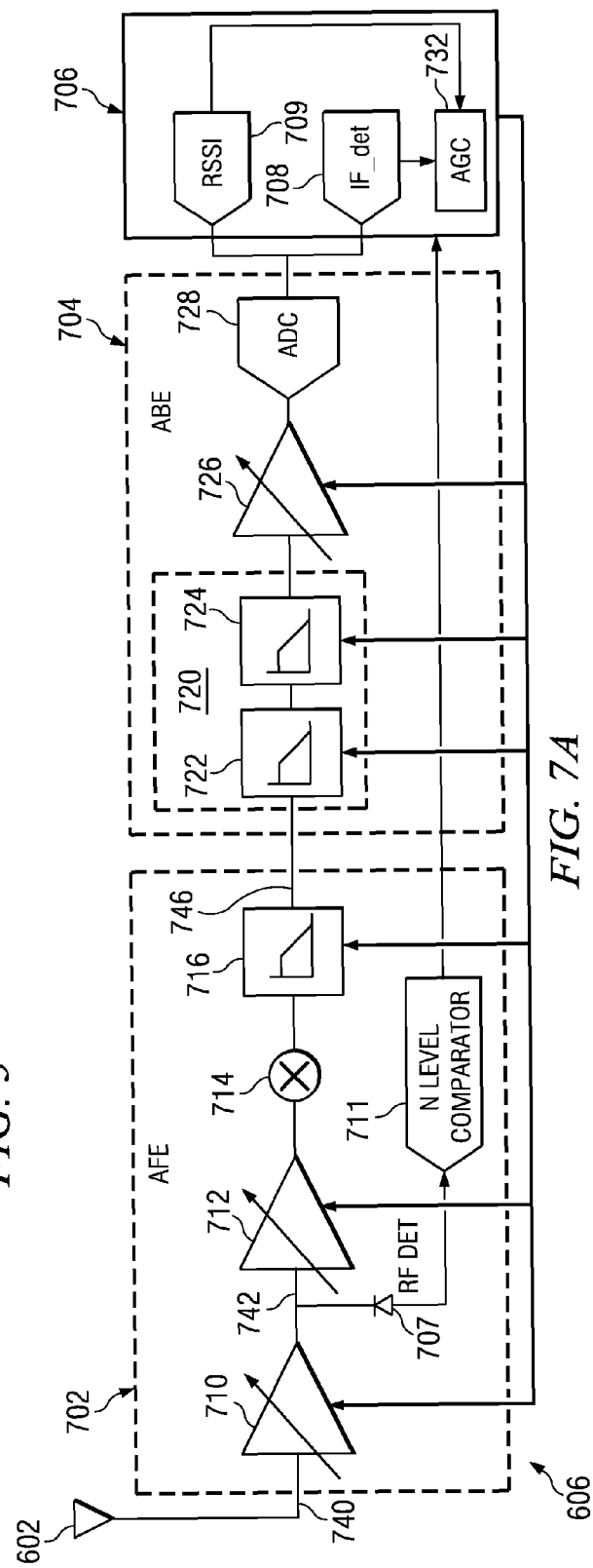
FIG. 5
FIG. 6
FIG. 7A

Vout= A*10log(Vin) + CONSTANT

METHODS AND APPARATUS TO IMPLEMENT RECEIVER LINEARITY ENHANCEMENT

TECHNICAL FIELD

The present disclosure pertains to communication systems and, more particularly, to methods and apparatus to implement receiver linearity enhancement.

BACKGROUND

Radio frequency (RF) communication devices, such as cellular telephones and the like, typically include a receiver lineup that is coupled to an antenna. The receiver lineup converts RF signals received by the antenna to intermediate frequencies and, ultimately, to baseband frequencies.

The presence of in-band and out-of-band blocker signals and modulated interferers in the area of a receiver can adversely affect the performance of the receiver lineup. Such blockers can compress the receiver and cause receiver noise floor to increase and receiver gain to decrease. Depending on blocker power and frequency, blockers can either compress RF front-end circuits or the IF back-end circuits in the receiver.

In the presence of large blockers, receivers use an Automatic Gain Control mechanism (AGC) to prevent saturation. Traditionally, these AGC schemes have utilized some form of baseband or RF detector that reduces the gain of the receiver in response to blocker presence. A baseband detector can detect both in-band signals and blockers located close to the in-band frequency. The detection bandwidth of baseband detectors are limited by the filtering in the receiver chain, which limits accessible frequency content. Out-of-band blockers and higher frequency in-band blockers are not easily detected in the baseband. Such blockers can compress the RF front-end of the receiver and lead to poor performance if the front-end components are not sufficiently linear.

An RF detector, such as a log amplifier, can detect far out blockers as well as in-band signals. An RF detector is usually placed at the front of the RF chain where there is less filtering and the detection bandwidth the largest. An RF detector gives no indication of the frequency location of the signals it measures, but can be used to reduce the gain of the receiver chain in response to a large detected signal. The main issue with this type of detector is that because it gives no indication of the blocker frequency it is difficult to determine the optimum gain selection for the receiver. For example, if an out of band blocker is input to the receiver, then to prevent the receiver front end circuits from compressing the gain of the RF blocks should be reduced. With this type of detector it is not possible to determine the frequency location of the blocker relative to the desired signal and so it is difficult to determine where to reduce the gain in the receiver chain. Also, most RF detectors have a limited input dynamic range and cannot reliably detect low power signals. These lower power signals, if located close to the band of interest, can be amplified in the RF front-end of the receiver and cause compression of the low frequency receiver back-end.

As supply voltages provided to receiver lineups are reduced in successive process nodes, it becomes more difficult for receiver lineups to meet linearity performance criteria specified by relevant communication standards and, thus, it becomes difficult for a receiver lineup to accommodate the presence of a blocker without becoming compressed. Additionally, receiver lineups that are highly linear generally do not represent optimum designs as they need to be over-designed to meet all linearity requirements over process and temperature.

A known receiver lineup is shown at reference numeral 100 in FIG. 1. The receiver lineup 100 includes a low noise amplifier (LNA) 102, which is coupled to an antenna 104. The LNA 102 is coupled to a mixer 106, the output of which is low pass filtered by a filter 108. Subsequently, the signal from the filter 108 is coupled to a variable gain amplifier 110 and a low pass filter 112, which is further coupled to a variable gain amplifier 114 and a low pass filter 116. The output of the low pass filter 116 is coupled to an analog-to-digital converter (A/D) 118. The A/D 118 transforms the analog signals from the low pass filter 116 to a digital format that may be processed by a digital baseband processor 120. As shown in FIG. 1, the digital baseband processor 120 includes an intermediate frequency (IF) detector 122, which may be implemented using hardware and/or software.

In operation, the signal at the antenna 104, shown at node 130, has characteristics as shown in FIG. 2. That is, an RF signal 202 that is much smaller than the amplitude of a blocker 204, which is an in-band or out-of-band blocker or modulated interferer from another device or from some other source.

As shown in FIG. 3, which represents the characteristics of the signals at node 132, after amplification by the low noise amplifier 102, the RF signal 302 and the blocker 304 are amplified, as is the noise floor 306. As will be readily appreciated, the high amplitude blocker 304, when provided to the mixer 106, creates additional noise because the mixer 106 is driven in a non-linear region of operation called compression. Compression of the mixer also causes its gain to decrease. The mixer compression dramatically increases the noise figure of the receiver lineup 100. This result is shown in FIG. 4, which represents the characteristics of the signals at node 134. As shown in FIG. 4, IF signal 402 and blocker 404 have increased in amplitude, but such an increase is not in proportion to the noise floor 406, which grows disproportionally due to the mixer compression caused by the blocker 304. The blocker cannot be easily eliminated or the mixer compression caused thereby detected because the blocker 304 will be subsequently filtered out before the signals reach the IF detector 122.

BRIEF DESCRIPTION OF THE DRAWINGS

FIG. 1 is a diagram of a known receiver lineup.

FIGS. 2-4 are plots showing characteristics of signals at various points within the receiver lineup of FIG. 1.

FIG. 5 is a diagram of a system including a mobile unit that includes the disclosed receiver linearity enhancement.

FIG. 6 is a diagram showing additional detail of the mobile unit of FIG. 5.

FIG. 7A is a diagram of an example receiver lineup including the disclosed receiver linearity enhancement.

DETAILED DESCRIPTION

Figure 7B:
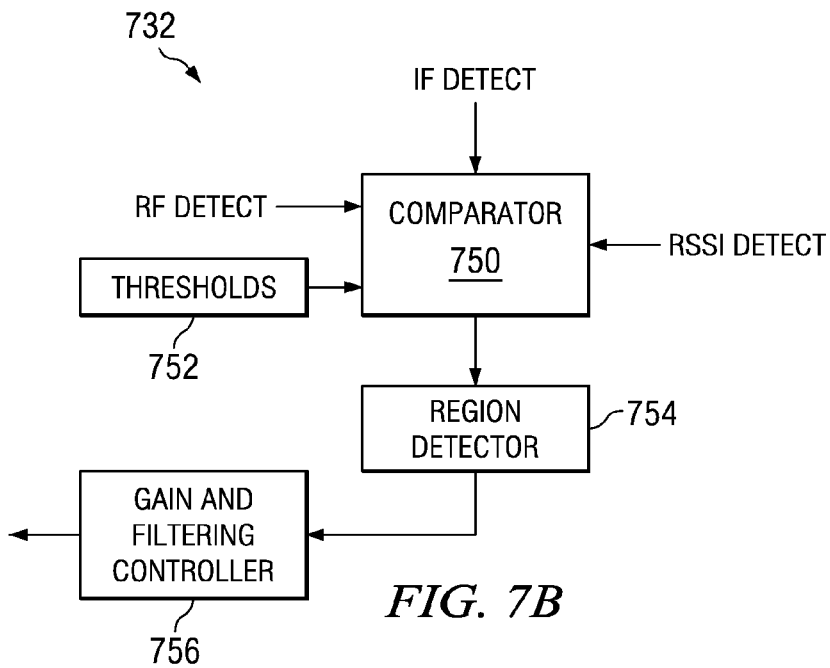
FIG. 7B is a diagram of an example implementation of the ACG of FIG. 7A.

Although the following discloses example systems including, among other components, software or firmware executed on hardware, or special-purpose hardware, it should be noted that such systems are merely illustrative and should not be considered as limiting. For example, it is contemplated that any form of logic may be used to implement the systems or subsystems disclosed herein. Logic may include, for example, implementations that are made exclusively in dedicated hardware (e.g., circuits, transistors, logic gates, hard-coded processors, programmable array logic (PAL), application-specific integrated circuits (ASICs), etc.) exclusively in software, exclusively in firmware, or some combination of hardware, firmware, and/or software. Accordingly, while the following describes example systems, persons of ordinary skill in the art will readily appreciate that the examples are not the only way to implement such systems.

Shown in FIG. 5 is an example communication system 500 in which the receiver linearity enhancement apparatus and methods disclosed herein may be used. The example communication system 500 includes a mobile unit 502, infrastructure 504, and a blocker 505, which may be an in-band blocker at RF frequencies or a blocker or modulated interferer at IF frequencies. The mobile unit 502 may be implemented using a cellular telephone, such as a global system for mobile communications (GSM) telephone, or any other type of telephone that may operate under the principles of frequency division multiple access (FDMA), time-division multiple access (TDMA), and/or code-division multiple access (CDMA). For example, the mobile unit 502 may operate using the advance mobile phone service (AMPS), IS-95, IS-136, or any other suitable protocol. As will be readily appreciated by those having ordinary skill in the art, the mobile unit 502 may include an earpiece speaker 506, a keypad 508, and a microphone 510 in addition to numerous other components, such as communications circuits.

The infrastructure 504 may be implemented using a base transceiver station (BTS) that is configured for wireless communications with the mobile unit 502. The infrastructure 504 may be coupled to one or more other infrastructure units, the plain old telephone system (POTS), or any other suitable network. As with the mobile unit 502, the infrastructure 504 may be implemented as a GSM base station, or as any other FDMA, TDMA, or CDMA compatible base station. In the example of FIG. 5, the communication protocols used by the mobile unit 502 and the infrastructure 504 are not important to this disclosure. Of course, the communication protocols used by the mobile unit 502 and the infrastructure 504 must be compatible for information exchange to be carried out between the mobile unit 502 and the infrastructure 504.

As shown in FIG. 6, the example mobile unit 502 may include an antenna 602 that is coupled to a transmitter 604 and is also coupled to a receiver 606. In the transmit path, audio from the microphone 510 is processed by the transmitter 604 and broadcast through the antenna to an intended recipient, such as a mobile communications base station (e.g., the base transceiver station 504 of FIG. 5). As will be readily appreciated by those having ordinary skill in the art, the transmitter 604 may operate using any number of different communication protocols. Not shown in detail in FIG. 6 is the transmit processing circuitry that may perform analog-to-digital conversion, voice encoding, forward error correction, and/or any other suitable processing that may be required to prepare the voice signals from the microphone 510 for transmission by the antenna 602.

As described in detail below, the receiver 606 includes, for example, amplification, downconversion, A/D conversion, and any other known or later developed receive processing needed to convert received RF signals at the antenna 602 to audio signals at the speaker 506. As described below, the receiver 606 includes blocker detection that provides feedback indicating when blockers are present. In response to the presence of one or more blockers, the receiver 606 of the mobile unit 502 may change the gain and filtering of certain components in the receiver 606 to reduce the overall noise figure of the receiver 606 by reducing the compression experienced by components in the system, thereby enhancing the linearity of the receiver. In one example, control of the gains and the filtering characteristics of the receiver components are done over a processor bus, such as an open core protocol (OCP) bus.

Though FIG. 7A illustrates a non-coherent receiver the same methods can be used equally well for a coherent implementation. The example receiver includes the analog front end 702, which receives an input from the antenna 602, the analog back end 704, and the digital baseband processor 706. The receiver 606 also includes an RF detector 707, an IF detector 708, and a received signal strength indicator (RSSI) detector 709. The RF detector 707 is located in at an output of an LNA 710 and is further coupled to an N level comparator 711. The IF detector 708 and the RSSI detector 709 are located in the digital baseband processor 706.

The analog front end 702 includes the LNA 710 cascaded with a transconductance amplifier (TA) 712, one or both of which are variable gain devices. The transconductance amplifier 712 has an output that is coupled to a mixer 714, which also receives an IF signal (not shown). The output from the mixer 714 at an IF is coupled to a low pass filter 716. As will be readily appreciated by those having ordinary skill in the art, the analog front end 702 may be implemented using any known or later developed components to implement the functionality represented in FIG. 7A.

The analog back end 704 includes an example switched capacitor filter 720, including first and second low pass filters 722, 724. The output of the switched capacitor filter 720 is coupled to a variable gain amplifier 726, the output of which is coupled to an A/D 728. As will be readily appreciated by those having ordinary skill in the art, the analog back end 704 may be implemented using any known or later developed components that implement the functionality shown in FIG. 7A.

The digital baseband processor 706 includes the IF detector 708, the RSSI detector 709, and an automatic gain control function 732, all of which may be implemented using hardware and/or combinations of hardware and software/firmware. The automatic gain control function 732 receives input from the comparator 711 and, as described below, controls the gains of the LNA 710 and/or the TA 712 and/or the variable gain amplifier 726 as well as the poles of the low pass filters 722 and 724.

The bandwidth of the filters 716, 722, and 724 limit the frequency over which the detectors 708, 709 can operate. However, when the information from the different detectors 707, 708, 709 are combined they can give a good indication of the frequency location and power of a blocker and, hence, a mitigation criteria can be determined that would obtain superior performance for the receiver in the detected operation condition.

Figure 8A:
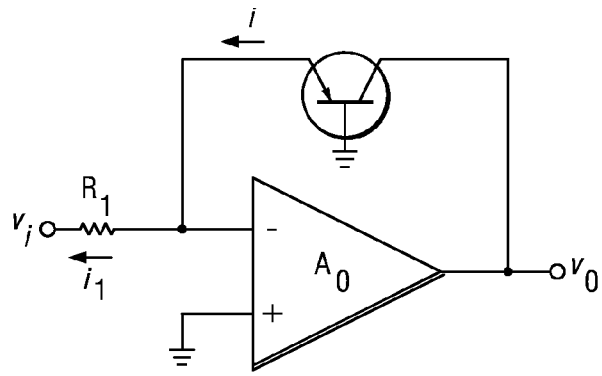
FIG. 8A is a diagram of an example logarithmic (log) amplifier.
Figure 8B:
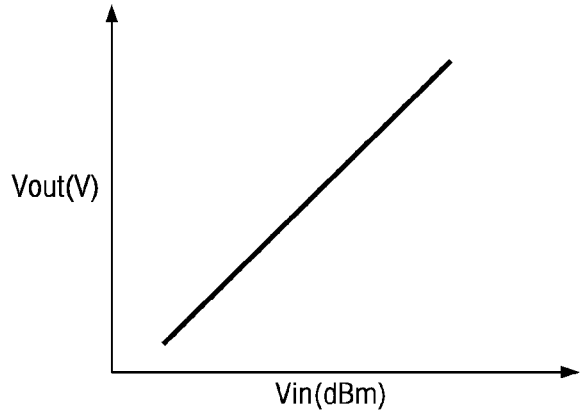
FIG. 8B is a diagram of the input Vs output characteristics of a log amplifier, such as the log amplifier of FIG. 8A.
Figure 9A:
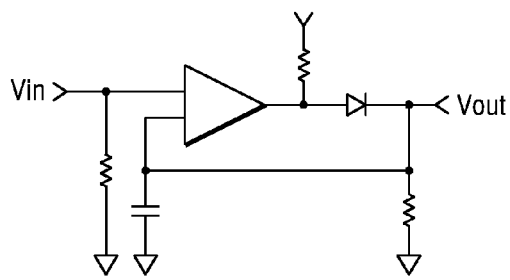
FIG. 9A is a diagram of an example peak detector.
Figure 9B:
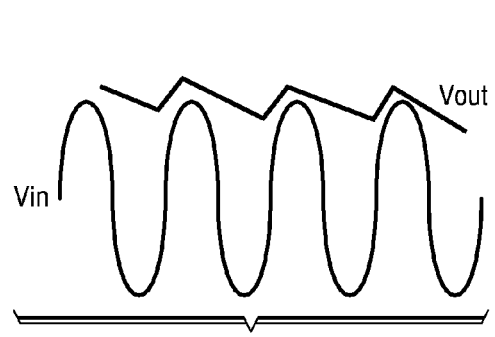
FIG. 9B is a diagram of the input and output waveforms of a peak detector, such as the peak detector of FIG. 9A.

The RF detector 707, which may be implemented using a log amplifier or peak detector such as those shown in FIGS. 8A and 9A, is located at the output of the LNA 710 and has a very large bandwidth and can be used to detect both in-band and out-of-band blockers. The log amplifier of FIG. 8A produces a non-linear voltage characteristic as shown in FIG. 8B. As shown in FIG. 9A, the peak detector produces an output signal that represents the peak of the input signal. The RF detector 707 generates output signals indicative of the entire signal it samples. This includes the signal of interest and any blockers that are incident on the antenna. The RF detector 707 can have either a linear or logarithmic response. The output of the RF detector 707 is fed to the N level comparator, or quantizer, 711, which converts the analog output of the RF detector 707 to a digital signal and passes it to the baseband processor 706 to be used as an input to the AGC 732. Here N of the N level comparator 711 is a positive integer that is preferably a power of 2.

Figure 10:
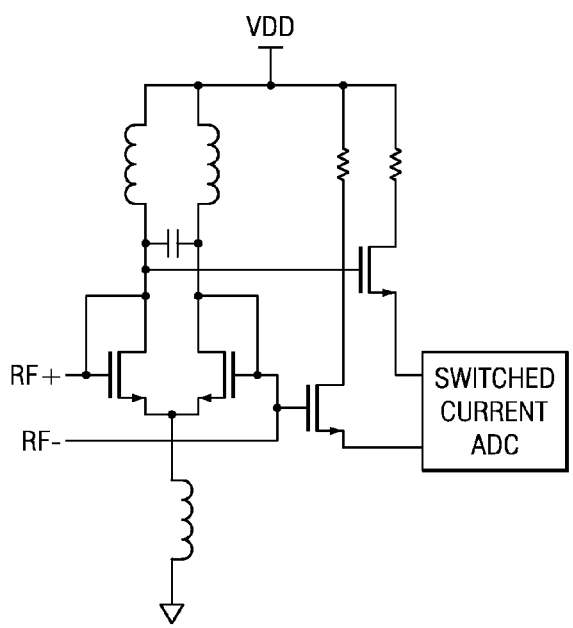
FIG. 10 is a diagram of an example current mode RF detector.

The log amplifier and the peak detector both monitor the output voltage of the LNA 710. Alternatively or additionally, it is possible to perform current monitoring of the LNA 710 as illustrated in FIG. 10. In the circuit of FIG. 10, the current in the main arms of the LNA 710 are mirrored and input to a switched current ADC, which outputs a digital code that can then be sent to the digital baseband processor 706 for further processing.

Figure 11:
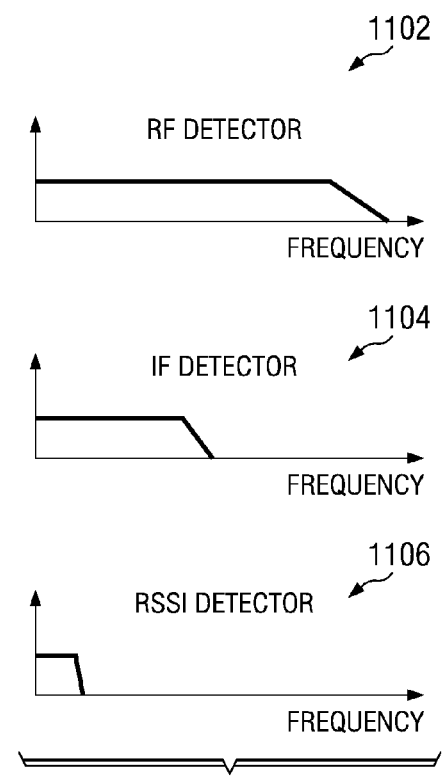
FIG. 11. is a diagram illustrating the bandwidths of the various detectors in the receiver of FIG. 7A.

As indicated in FIG. 7A the receiver also has other lower bandwidth detectors 708, 709 in the digital baseband processor 706. The IF detector 708 can be used to monitor the low frequency in-band blockers and low frequency modulated interferers while the RSSI circuit 709 may be used to measure the power of the desired signal. The bandwidths of these detectors in comparison to the bandwidth of the RF detector 707 are illustrated in FIG. 11, wherein the bandwidths of the RF detector, the IF detector, and the RSSI detector are respectively shown at reference numerals 1102, 1104, and 1106.

In operation, each detector performs an integration of energy over a certain bandwidth and each filtering stage reduces the signal bandwidth seen by the subsequent stages. The envelope of the signal is detected and termed as RSSI at the point of measurement. By comparing the outputs from the RF detector 707, the IF detector 708, and the RSSI detector 709, it is possible to determine the frequency region in which a blocker is located. This method can be extended to more closely spaced frequency bands by using more detectors. The AGC 732, example of which is shown in FIG. 7B, uses inputs from these detectors, as well as the operating temperature information from a temperature sensor (not shown) and process information about the chip to adjust the gain and filtering characteristics of the receiver 606 to cater to various operating conditions.

Figure 12:
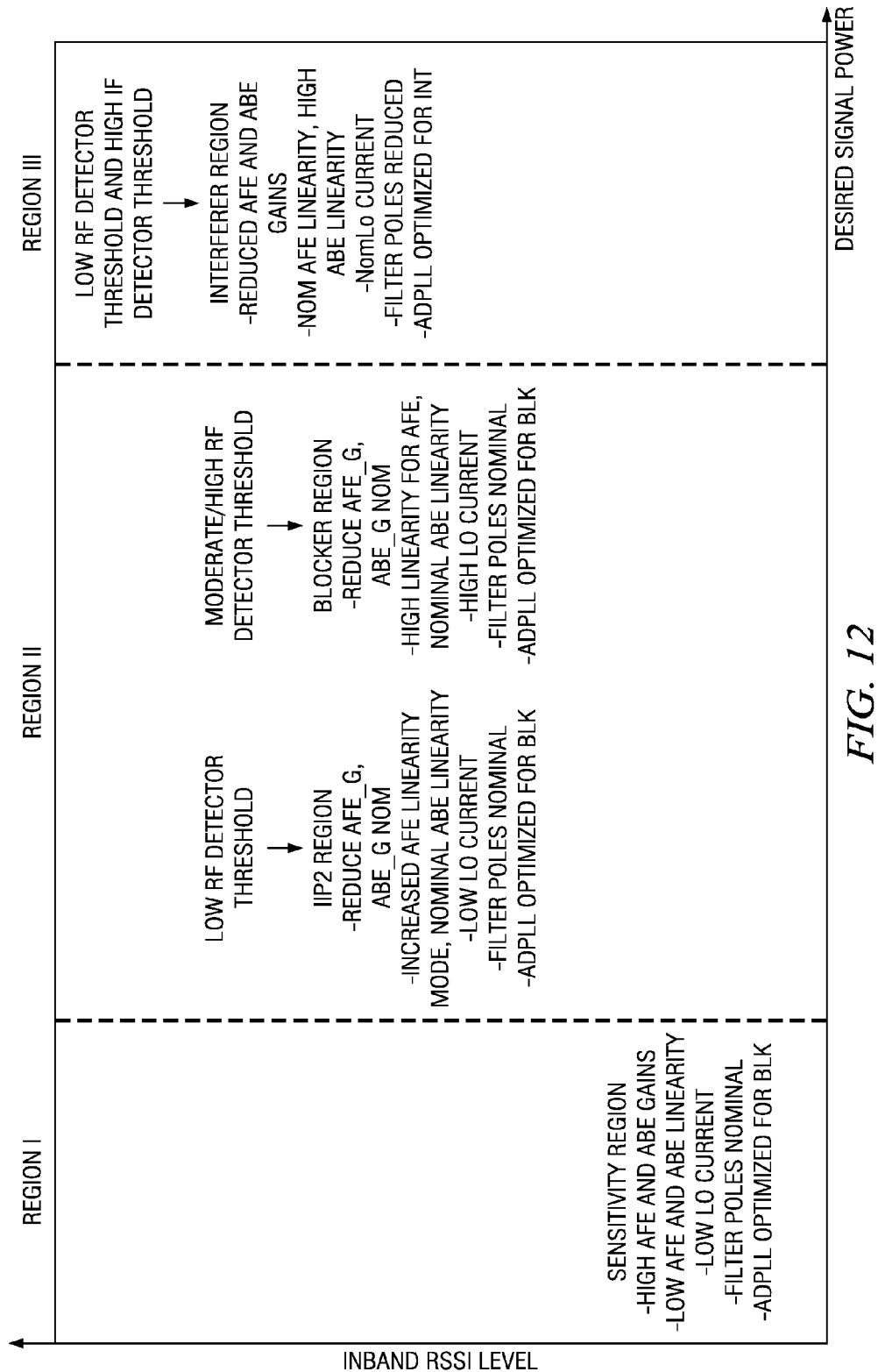
FIG. 12 is a diagram illustrating various receiver operating regions.

As shown in FIG. 7B, the AGC 732 includes a comparator 750 that receives inputs from the RF detector, the IF detector and the RSSI detector. Additionally, the comparator 750 receives threshold inputs 752 to which the detector inputs can be compared. The results of the comparisons, which are described below in conjunction with FIG. 12, are coupled to a region detector 754. Based on the comparison results, the region detector 754 determines a region in which the receiver 606 is operating. The region determination is passed from the region detector 754 to a gain and filtering controller 756 that controls the values of gains and filtering in various components of the receiver 606. The gain and filtering controller 756 operates as described in conjunction with FIG. 12.

Although the foregoing functionality associated with FIG. 7B is described as being associated with an ACG (e.g., the ACG 732), it should be noted that this is not necessarily the case. For example, the functionality of FIG. 7B may be implemented separate from the AGC in a dedicated module or block that interfaces with the ACG.

Using the information from the detectors 707-709, the receiver 706 operation can be divided into several regions, with each region being optimized to handle a specific operating condition. FIG. 12 shows an example of the various operation regions for a GSM receiver. In FIG. 12, the X axis indicates the desired signal power and the Y axis indicates the detected inband RSSI. The desired signal power and the measured RSSI vary proportionally to each other. Depending on the levels detected by the RF and IF detectors 707 and 708, combined with the RSSI level from the RSSI detector 709, the receiver 606 operation can be subdivided into several regions. In each region the receiver gain, filtering, current consumption and local oscillator settings can be specified to optimize receiver performance and to alleviate the detrimental effects of blockers and interferers entering the receiver.

When constructing the various regions for a given communications standard first the different regions of operation have to be identified. Most communication standards have similar operating regimes and impairments under which they have to operate. These regions can be broadly categorized into a sensitivity region, a blocker region, interferer region, peak SNR region. In the sensitivity region the receiver 606 is configured to receive the smallest possible signals. In the blocker region the receiver 606 is optimized for performance in the presence of large signal blockers. In the interferer region the receiver 606 has to operate in the presence of modulated close in signals, and in the SNR region the receiver 606 is optimized to maximize the signal to noise ratio of the received signal.

Once the various regions of operation are identified, the detector outputs corresponding to each region are determined. This enables the differentiation of the various regions and helps identify the transition of the receiver 606 from one operating region to another. Finally, the operating conditions for each region are identified so as to optimize the receiver 606 performance in each region. FIG. 12 presents the various operating regions for a GSM receiver.

In FIG. 12 region I denotes the sensitivity region of operation. In this region the receiver 606 is optimized to receive the lowest power signals and blockers are not present. This represents the most sensitive region of the receiver 606 in which the noise figure is the lowest. In order to minimize the noise figure both the AFE 702 and ABE 704 gains are set high while the absence of blockers enables the linearity of the receiver blocks to be set low. That is the amplifiers 710, 712, and 726 are set to relatively high gains and the filter poles of filters 716, 722, and 724 are set to their nominal values. Additionally, the local oscillator current consumption is set low as the absence of blockers enables the local oscillator phase noise not to be a concern in this region.

In region II, the received RSSI is larger and two possible courses of action are available depending on the level detected by the RF detector 707. If the RF detector 707 outputs a low level, then the receiver 606 is assumed to be in the IIP2 region. In this region the AFE 702 gain (as set by amplifiers 710 and 712) can be reduced in order to maximize the second order nonlinearity, IIP2, performance of the receiver 606. The ABE 704 gain (as set by the amplifier 726) is set to a nominal value as the ABE 704 does not have a large impact on linearity performance. AFE 702 linearity is set high in order to maximize the overall linearity performance of the receiver 606. The local oscillator current is kept low as the interfering signal is several megahertz from the desired channel, making reciprocal mixing of phase noise not a concern. The filter poles of the filters 716, 722, and 724 are kept at their nominal values as filtering is not important in this region.

In region II, if the RF detector 707 output is moderate to high then the receiver 606 is assumed to be in the blocker region. Here the AFE 702 gain is reduced (by controlling the amplifiers 710, 712) from that used in region I in order to increase linearity and the ABE 704 gain is set to a nominal value (via the amplifier 726) as it does not impact the blocker performance. The AFE 702 linearity is increased to maximize the front-end linearity of the receiver 606, and the local oscillator phase noise is optimized to minimize the noise introduced into the desired channel by reciprocal mixing. The phase noise of the local oscillator is reduced by increasing its current consumption.

In region III, the received RSSI is the largest, which represents the interferer region. Interferers are different from blockers in that they are modulated signals that are usually located much closer to the desired channel than continuous wave blockers. Interferers tend to have lower power than blockers, but undergo little system filtering in the receiver 606 due to their frequency proximity to desired channel. These types of signals tend to compress the IF back-end of the receiver. The presence of interferers in the receiver 606 can be detected from the presence of a large output from the IF detector 708 located in the baseband processor 706 of the receiver 706. The large IF detector 708 output combined with the large RSSI level at the RSSI detector 709 and a low RF detector 707 level indicate that the receiver 606 is in region III of operation. In region III, both the AFE 702 and the ABE 704 gains are reduced by controlling the amplifiers 710, 712, and 726 so as to prevent the interferer from saturating the ABE 704. The AFE 702 linearity is set to a nominal value while the ABE 704 linearity is increased. The filter poles (e.g., the poles of filters 716, 722, and 724) of the receiver 606 are also reduced to obtain greater filtering for interferers. Additionally, the local oscillator is optimized to minimize the close in-phase noise so as to reduce the noise folded in-band by the interferers.

As illustrated in FIG. 7A, the gain and filtering may be adjusted at one or more points in the receiver 606 lineup, thereby providing maximum operational flexibility. This method of dividing the receiver operation into several regions can be extended to radios using different mobile standards and in its most general application can be used in multimode applications for controlling the operation of a software defined radio receiver covering many standards. In a multimode radio there can be more detectors, if required, to cater to the particular requirements of different standards. This method of receiver control also enables the optimization of current consumption whereby the receiver blocks requiring less linearity can be operated with less current. For example, in region II the back-end of the receiver requires low linearity and hence can be operated with less current. Also this gain control method allows the frequency response of the local oscillator to be modified in the different regions of operation to cater to either both in-band blockers and modulated interferers, out-of-band blockers or in-band signal to noise ratio.

Figure 13:
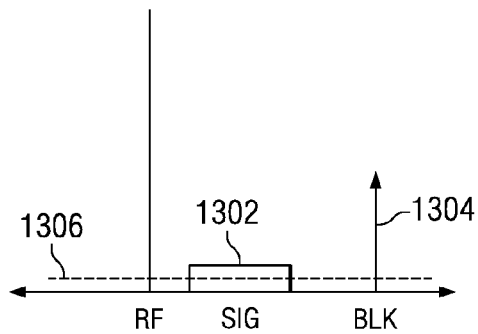
FIGS. 13-15 are plots showing example characteristics of signals at various points within the receiver lineup of FIG. 7A.

In operation, RF signals create current on the antenna 602. The antenna currents are converted to voltages that are passed to a receiver 606 for further processing, such as that described below. In one example, the signals on the antenna 602, which are also input to the LNA 710, shown at node 740, have characteristics as shown in FIG. 13. That is, an RF signal 1302 has an amplitude smaller than the amplitude of the blocker 1304, which is an in-band or out-of-band blocker or modulated interferer from another device or from some other source. In FIG. 13, both the RF signal 1302 and the blocker 1304 exceed the level of a noise floor 1306.

Figure 14:
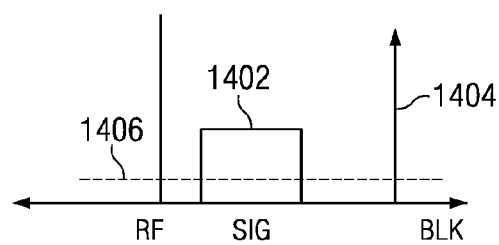

The LNA 710 amplifies the RF signal 1302, the blocker 1304, and the noise floor 1306 and produces a signal at a node 742, the characteristics of which are shown in FIG. 14. As shown in FIG. 14, the RF signal 1402, the blocker 1404, and the noise floor 1406 are amplified by the LNA 710. As shown in the example of FIG. 7, an input to the RF detector 707 is taken from the node 742 in part because the LNA output is one of the largest bandwidth points in the receiver 606 and, thus, detection of high IF signals that are otherwise not detectable at other points in the lineup are present at node 742. As described, below, the N level comparator 711 is programmed to compare the signals from the level detector 707 to one or more thresholds. Based on the threshold comparisons, the digital baseband processor 706 controls the gains of the LNA 710 and the TA 712 to reduce the compression in the receiver 606.

Figure 15:
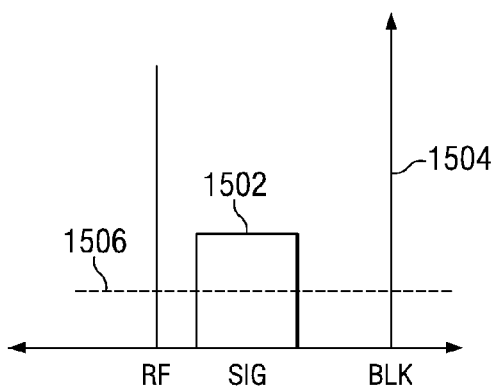

The output from the LNA 710 is coupled to the TA 712, which, as noted above, has a gain controlled by the digital baseband processor 706 to reduce compression in the receiver 606. The output of the TA 712 is coupled to the mixer 714 to downconvert the RF signal to an IF that is subsequently filtered by the low pass filter 716. The output of the low pass filter 716 at a node 746 is shown in FIG. 15. As shown in FIG. 15, the levels of the IF signal 1502 and the blocker 1504 have increased, but, in contrast to the signals in FIG. 4, the noise floor has not increased to the same extent. That is, by controlling the level of the signals coupled to the mixer 714, or, for that matter any other RF or IF component, the compression experienced by those components is reduced and, thus, the noise floor level does not grow disproportionately because those components are operating in a linear mode.

Subsequent to the filtering at the low pass filter 716, the switched capacitor filter 720 low pass filters the signals, which are then amplified by the variable gain amplifier 726, the gain of which is also controlled by the digital baseband processor 706. The signals from the variable gain amplifier 726 are subsequently processed by the A/D 728 and passed to the IF detector 730 within the digital baseband processor 706.

Figure 16:
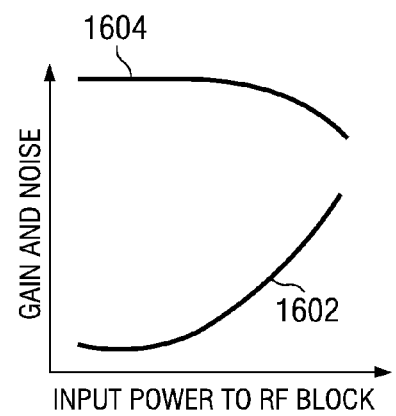
FIG. 16 is a plot showing an example relationship between gain compression and noise compression in an RF device.

FIG. 16 shows the relationship between gain compression and noise resulting from gain compression. As shown, for a given low input power level to an RF block, such as, for example, a mixer, the internally-generated noise is at a level indicated by a line 1602 and gain is at a level indicated by the line 1604. However, as input power level increases, gain compression begins to occur. For example, as shown in FIG. 16, the line 1604 remains substantially flat, indicating that gain in the RF block is fixed, until input power level increases to a point at which the RF block can no longer maintain the fixed gain and the line 1604 begins to curve downward. While gain compression is sensitive to input signal level, noise at line 1602 is very affected by input signal level. That is, as gain begins to compress, the noise level begins to increase rapidly as noted by the upturn in the line 1602. Thus, the reduction in compression experienced by an RF block, such as a mixer, also reduces the noise contributed by that block. The input level under consideration is not only the input level of the desired signal, but is also the level of any blockers that are passed to the RF block.

Having described the architecture of one example system that may be used to reduce the linearity requirements of receiver components, various processes are described. Although the following discloses example processes through the use of flow diagrams having blocks, it should be noted that these processes may be implemented in any suitable manner. For example, the processes may be implemented using, among other components, software, or firmware executed on hardware. However, this is merely one example and it is contemplated that any form of logic may be used to implement the systems or subsystems disclosed herein. Logic may include, for example, implementations that are made exclusively in dedicated hardware (e.g., circuits, transistors, logic gates, hard-coded processors, programmable array logic (PAL), application-specific integrated circuits (ASICs), etc.) exclusively in software, exclusively in firmware, or some combination of hardware, firmware, and/or software. For example, instructions representing some or all of the blocks shown in the flow diagrams may be stored in one or more memories or other machine readable media, such as hard drives or the like. Such instructions may be hard coded or may be alterable. Additionally, some portions of the process may be carried out manually. Furthermore, while each of the processes described herein is shown in a particular order, those having ordinary skill in the art will readily recognize that such an ordering is merely one example and numerous other orders exist. Accordingly, while the following describes example processes, persons of ordinary skill in the art will readily appreciate that the examples are not the only way to implement such processes.

Figure 17:
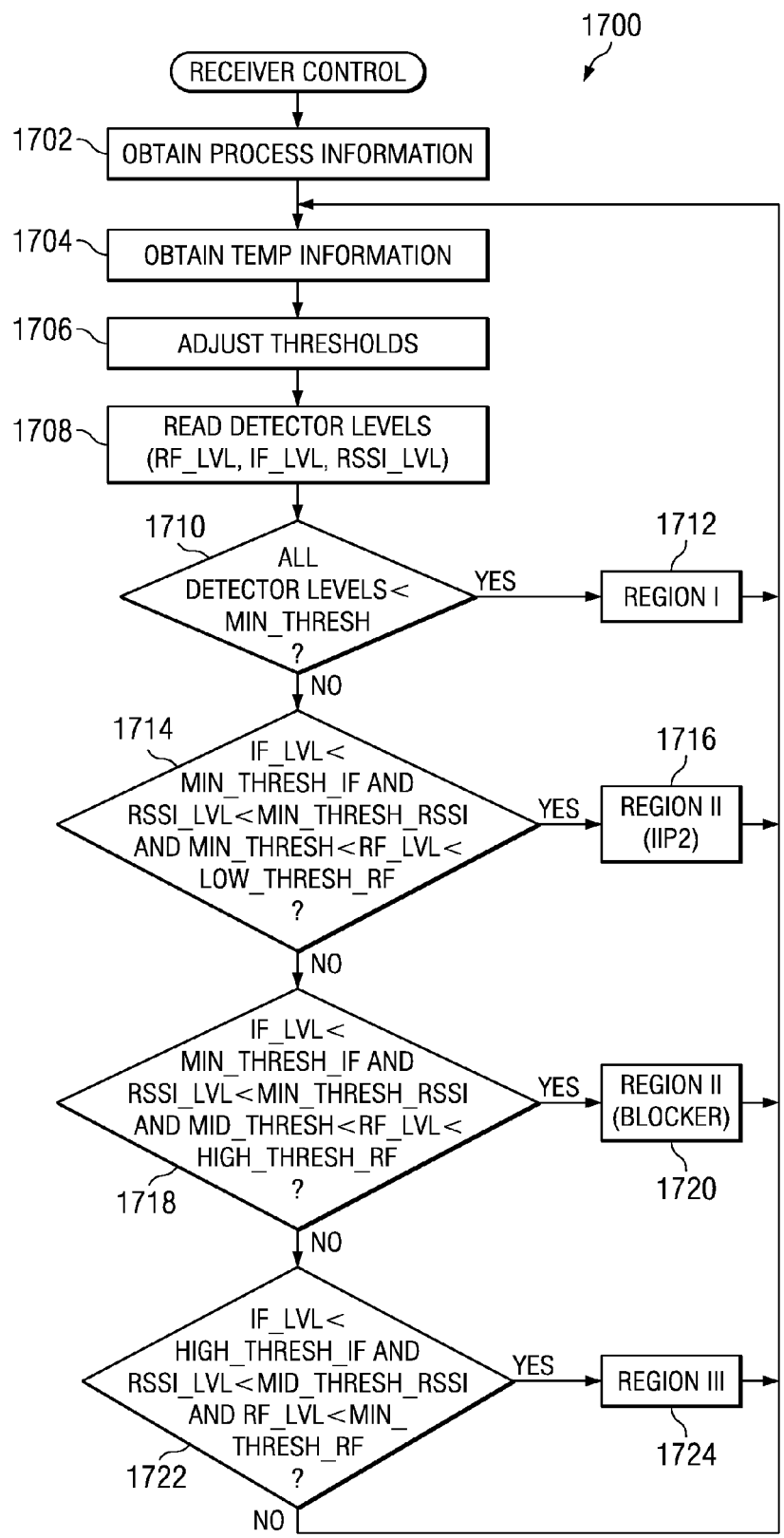
FIG. 17 is a diagram illustrating a gain control process that may be implemented in the example receiver lineup of FIG. 7A.

FIG. 17 is a flow diagram of a receiver control process 1700 that may be performed by the digital baseband processor 706 and, in particular, the automatic gain controller 732 of the digital baseband processor 706. In general, the process 1700 reads levels from various level detectors and compares the levels to thresholds. Based on the results of the comparisons, an operating region of the receiver 606 is determined. Based on the determination of operating region, the receiver 606 may control the gains and frequency responses of various components in the receiver 606, as described above in conjunction with each of the regions. The thresholds below may be analog signals that are sampled, or may be a collection of bytes or bits stored in a memory location, such as a register, to represent signal levels above which an input signal level should be attenuated to reduce noise generation in the receiver 606.

The process 1700 begins by reading system information, such as chip process information (block 1702) and chip operating temperature (block 1704). Based on the system information, threshold levels for each of the detectors (e.g., the detectors 707, 708, and 709) are adjusted to account for these variations (block 1706). The signals levels provided by each detector (e.g., the detectors 707, 708, and 709) are then read (block 1708). In this example, the variable RF_LVL corresponds to the level read by the RF detector 707 at the output of the LNA 710. This reading contains the in-band signal as well as in-band and out of band blockers and interferers. The variables IF_LVL and RSSI_LVL, which correspond to the levels read at the IF detector 708 and the RSSI detector 709, respectively, read in the digital baseband processor 706. The IF_LVL reading contains both the in-band signal and blockers and interferers located close to the in-band signal. The RSSI_LVL contains only the signal of interest.

The levels read from the detectors 707, 708, and 709 (block 1706) are then compared to the threshold values calculated at block 1704 to determine the region of operation into which the receiver 606 should be placed. Block 1710 determines if the region of operation is region I (block 1712) by determining if all detector levels are below a minimum threshold level. If one or more of the measured levels from the detectors exceed the minimum thresholds (block 1710), the process 1700 compares the detector levels to various thresholds to determine if the receiver should be operating in the IIP2 region II. For example, the process 1700 may compare the IF level, the RSSI level, and the RF level to minimum thresholds. If the threshold comparisons are favorable, it is determined that the receiver should be operated in the IIP2 region II.

If the comparisons to the thresholds do not correspond to IIP2 region II, the IF, RSSI, and RF detector levels are respectively compared to the minimum thresholds for the IF and RSSI, and the high RF threshold (block 1718). If the detector levels exceed each of these thresholds, the receiver 606 is in blocker region II (block 1720).

If the receiver is not in blocker region II, the IF, RSSI, and RF levels are compared to high, mid and min thresholds for IF, RSSI, and RF, respectively (block 1722). If the detector levels exceed these thresholds, the receiver 606 is operating in region III. Alternatively, an error has occurred and the process 1700 returns to block 1704. Additionally, the process 1700 will iterate periodically, which causes control to flow from blocks 1712, 1716, 1720, and 1724 to block 1704.

Figure 18:
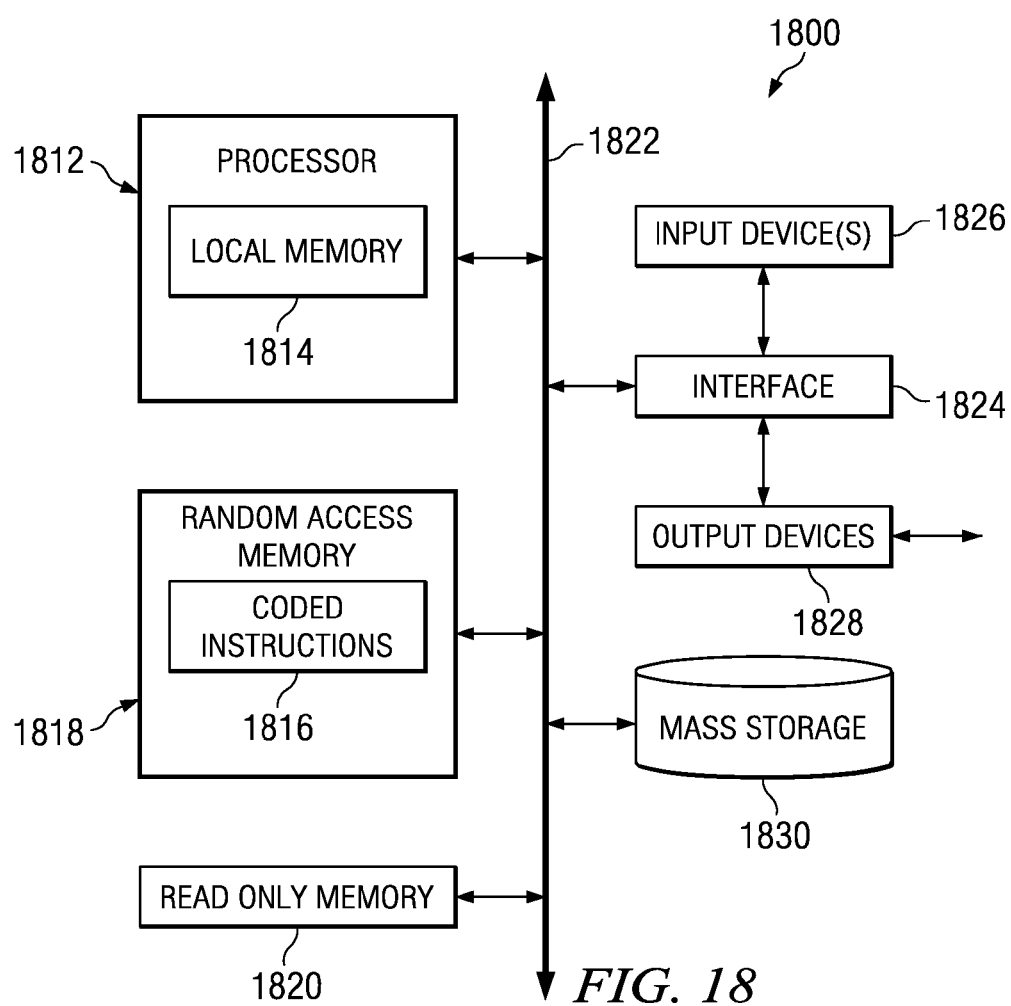
FIG. 18 is a block diagram of an example processor system on which machine or computer readable instructions implementing some or all of the process of FIG. 17 may be implemented.

FIG. 18 is a block diagram of an example computer 1800 capable of implementing the apparatus and methods disclosed herein. The computer 1800 can be, for example, a processing device, a communication device, a server, a personal computer, a personal digital assistant (PDA), an Internet appliance, a DVD player, a CD player, a digital video recorder, a personal video recorder, a set top box, or any other type of computing device.

The system 1800 of the instant example includes a processor 1812 such as a general purpose programmable processor. The processor 1812 includes a local memory 1814, and executes coded instructions 1816 present in the local memory 1814 and/or in another memory device. The processor 1812 may execute, among other things, machine readable instructions implementing the process represented in FIG. 17. The processor 1812 may be any type of processing unit, such as one or more microprocessors from the Texas Instruments OMAP® family of microprocessors. Of course, other processors from other families are also appropriate.

The processor 1812 is in communication with a main memory including a volatile memory 1818 and a non-volatile memory 1820 via a bus 1822. The volatile memory 1818 may be implemented by Static Random Access Memory (SRAM), Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1820 may be implemented by flash memory and/or any other desired type of memory device. Access to the main memory 1818, 1820 is typically controlled by a memory controller (not shown).

The computer 1800 also includes an interface circuit 1824. The interface circuit 1824 may be implemented by any type of interface standard, such as a serial bus, an Ethernet interface, a universal serial bus (USB), and/or a third generation input/output (3GIO) interface.

One or more input devices 1826 are connected to the interface circuit 1824. The input device(s) 1826 permit a user to enter data and commands into the processor 1812. The input device(s) can be implemented by, for example, a keyboard, a mouse, a touch screen, a track-pad, a trackball, an isopoint and/or a voice recognition system.

Output devices 1828 can be implemented, for example, by display devices (e.g., a liquid crystal display, a cathode ray tube display (CRT)), by a printer and/or by speakers. The interface circuit 1824, thus, typically includes a graphics driver card.

The interface circuit 1824 also includes a communication device such as a modem or network interface card to facilitate exchange of data with external computers via a network (e.g., an Ethernet connection, a digital subscriber line (DSL), a telephone line, coaxial cable, a cellular telephone system, etc.).

The computer 1800 also includes one or more mass storage devices 1830 for storing software and data. Examples of such mass storage devices 1830 include floppy disk drives, hard drive disks, compact disk drives and digital versatile disk (DVD) drives.

As described above, the methods and/or apparatus described herein may be embedded in a structure such as a processor and/or an ASIC (application specific integrated circuit).

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of controlling receiver gain, the method comprising:
   determining a level of a received signal that is to be provided to a radio frequency component;
   determining if the level of the received signal would cause the radio frequency components internally-generated noise to increase; and
   when the level of the received signal would cause the radio frequency components internally generated noise to increase, reducing the level of the received signal prior to providing the received signal to the radio frequency component.

2. A method as defined by claim 1, wherein determining the level of the received signal comprises determining a level of signals within a frequency band.

3. A method as defined by claim 2, wherein the received signal comprises a blocker signal.

4. A method as defined by claim 1, wherein determining if the level of the received signal would cause the radio frequency components internally generated noise to increase comprises comparing the level of the received signal to a threshold.

5. A method as defined by claim 4, wherein the threshold is indicative of an input signal level beyond which the radio frequency components internally generated noise will increase.

6. A method as defined by claim 5, wherein the threshold is indicative of an input signal level at which gain compression of the radio frequency component occurs.

7. A method as defined by claim 1, wherein reducing the level of the received signal prior to providing the received signal to the radio frequency component comprises reducing a gain of a component producing the received signal.

8. A method as defined by claim 7, further comprising increasing a gain of another component in response to reducing the gain of the component producing the received signal.

9. A system of controlling receiver gain, the system comprising:
   a detector to determine a level of a received signal that is to be provided to a radio frequency component;
   a comparator to determine if the level of the received signal would cause the radio frequency components internally generated noise to increase; and
   a controller that when the level of the received signal would cause the radio frequency components internally generated noise to increase, reduces the level of the received signal prior to providing the received signal to the radio frequency component.

10. A system as defined by claim 9, wherein the comparator compares the level of the received signal to a threshold.

11. A system as defined by claim 10, wherein the threshold is indicative of an input signal level beyond which the radio frequency components internally generated noise will increase.

12. A system as defined by claim 11, wherein the threshold is indicative of an input signal level at which gain compression of the radio frequency component occurs.

13. An article of manufacture comprising a computer-accessible medium having a plurality of computer accessible instructions that, when executed, cause a computer to:
   determine a level of a received signal that is to be provided to a radio frequency component;
   determine if the level of the received signal would cause the radio frequency components internally generated noise to increase; and
   when the level of the received signal would cause the radio frequency components internally generated noise to increase, reduce the level of the received signal prior to providing the received signal to the radio frequency component.

14. A method of controlling receiver operation, the method comprising:
   reading a first output from a first detector in a first region of the receiver;
   reading a second output from a second detector in a second region of the receiver;
   comparing the first output to a first threshold and comparing the second output to a second threshold; and
   varying filtering of the receiver based upon the results of the comparisons.

15. A method as defined by claim 14, further comprising identifying a frequency of a blocker signal.

16. A method as defined by claim 14, further comprising operating portions of the receiver not required to be operated at high linearity at reduced operating currents.

17. A method as defined by claim 14, wherein the first detector is in an analog front end.

18. A method as defined by claim 17, wherein the second detector is in a digital baseband processor.

19. A receiver system comprising:
   a first detector in a first region of the receiver, the first detector to produce a first output signal;
   a second detector in a second region of the receiver, the second detector to produce a second output signal;
   a comparator to compare the first output to a first threshold and to compare the second output to a second threshold; and
   a controller to vary filtering of the receiver based upon the results of the comparisons.

20. A receiver system as defined by claim 19, wherein the first detector is in an analog front end.

21. A receiver system as defined by claim 19, wherein the first detector comprises a radio frequency (RF) detector.

22. A receiver system as defined by claim 19, wherein the second detector is in a digital baseband processor.

23. A receiver system as defined by claim 22, wherein the second detector comprises an intermediate frequency (IF) detector.

24. A receiver system as defined by claim 22, wherein the second detector comprises a receive signal strength indicator (RSSI) detector.

25. A receiver system comprising:
  a first detector in a first region of the receiver, the first detector to produce a first output signal;
  a second detector in a second region of the receiver, the second detector to produce a second output signal;
  a third detector to produce a third output signal;
  a comparator to compare the first output to a first threshold, to compare the second output to a second threshold, and to compare the third output to a third threshold; and
  a controller to vary receiver gain based upon the results of the comparisons.

* * * * *